United States Patent
Ro et al.

[11] Patent Number: 5,858,818
[45] Date of Patent: Jan. 12, 1999

[54] FORMATION OF INGASA P-N JUNCTION BY CONTROL OF GROWTH TEMPERATURE

[75] Inventors: Jeong-Rae Ro; Seong-Bock Kim; El-Hang Lee, all of Daejeon, Rep. of Korea

[73] Assignee: Electronics and Telecommunications Research Institute, Daejeon, Rep. of Korea

[21] Appl. No.: 716,646

[22] Filed: Sep. 16, 1996

[30] Foreign Application Priority Data

Dec. 20, 1995 [KR] Rep. of Korea ............... 95-56270

[51] Int. Cl.$^6$ ............................................. H01L 21/203
[52] U.S. Cl. .................... 438/133; 145/DIG. 65; 145/DIG. 72; 145/DIG. 110; 145/DIG. 160; 438/312; 438/191; 438/357
[58] Field of Search ................... 438/453, 133, 438/312, 357, 191

[56] References Cited

U.S. PATENT DOCUMENTS

| | | | |
|---|---|---|---|
| 4,533,410 | 8/1985 | Ogura et al. | 148/175 |
| 4,829,022 | 5/1989 | Kobayashi et al. | 117/91 |
| 5,332,451 | 7/1994 | Hata et al. | 438/172 |
| 5,458,689 | 10/1995 | Saito | 118/724 |
| 5,578,521 | 11/1996 | Suzuki et al. | 438/493 |

*Primary Examiner*—Charles Bowers
*Assistant Examiner*—David S. Blum
*Attorney, Agent, or Firm*—Nixon & Vanderhye P.C.

[57] ABSTRACT

An epitaxial growth method for a compound semiconductor thin film, capable of forming a p-n junction with an atomic-scale ultra-micro structure is disclosed. The method involves loading the compound semiconductor substrate in a reaction chamber, injecting Group V and III metal organic source gases not processed by a thermal pre-decomposition process into the reaction chamber, and growing a p- or n-type compound semiconductor on the compound semiconductor substrate while adjusting the growth temperature of the p- or n-type compound semiconductor.

10 Claims, 1 Drawing Sheet

FORMATION OF INGASA P-N JUNCTION BY CONTROL OF GROWTH TEMPERATURE

BACKGROUND OF THE INVENTION

1. Field of the Invention

The present invention relates to an epitaxial growth method for compound semiconductor thin films, and more particularly to an epitaxial growth method for a compound semiconductor thin film, capable of forming a p-n junction by control of growth temperature.

2. Description of the Prior Art

Recently, growth of semiconductors with a heterojunction structure, in particular, compound semiconductors, has been widely used by virtue of the development of thin film growth techniques and equipment and the development of molecular beam epitaxy (MBE) and metalorganic chemical vapor deposition (MOCVD) methods. Also, semiconductor devices using hetero-junction structures made of a variety of compound semiconductors have been widely used.

In the growth of such structures over a semiconductor substrate, it is necessary to grow a layer containing an n or p type impurity on a semiconductor substrate. By the growth of such a doped layer, a p-n junction structure, which is a heterojunction structure between p type layer and n type layer to be grown on the substrate, is formed. Such a heterojunction structure has been widely used.

In this connection, the adjustment of the concentration of the impurity contained in the doped layer and the adjustment of the conductivity-type of the doped layer are important factors for determining the characteristic of the final semiconductor device. In this regard, it is known that the development of doping processes is commercially and technically important.

Recently, heterojunction bipolar transistors (HBTs) using III–V compound semiconductors have been getting popular by virtue of their superior characteristics expected in high-speed devices. In particular, the epitaxy of InGaAs with p type carriers is an important technique in the fabrication of InGaAs/InP heterojunction bipolar transistors.

In order to realize such heterojunction bipolar transistors operating at a high speed, a reduced base resistance should be used. To this end, a very large amount of impurity should be doped in the base layer of a transistor structure in the fabrication of the transistor structure.

However, beryllium (Be) or zinc (Zn) conventionally used as a p type impurity exhibits a very large diffusion coefficient at a high doping concentration. In this case, the performance of the semiconductor device is degraded.

In order to overcome such a problem, research on doping of a carbon impurity in an InGaAs is being made. Such a carbon impurity has superior characteristics in that it exhibits a low diffusion coefficient upon the growth of a GaAs and a high doping concentration.

Generally, the carbon impurity is known to have an n type conductivity in InGaAs. As a result of such research, it is also known that it is impossible to grow InGaAs with p type carriers using metalorganic compounds as a Group III source material. It is also known that such a p type InGaAs can be formed only when a source impurity material such as carbon tetrachloride ($CCl_4$) is additionally supplied. Recently, it has also been reported that the p type InGaAs can be grown only when solid indium is used as a source material for providing indium (Reference: T. P. Chin et al, Highly Carbon-Doped P-Type GaInAs and GaInP by Carbon Tetrachloride in Gas Source Molecular beam Epitaxy, Appl. Phys. Lett., 59:2865, 1991).

Thus, the conventional techniques have a problem in that two different doping processes are required to form a p-n junction structure of InGaAs.

SUMMARY OF THE INVENTION

Therefore, an object of the invention is to provide an epitaxial growth method for compound semiconductor thin films, capable of controlling the carrier type of a grown InGaAs thin film and the doping concentration by controlling the kind of source gas and the temperature of a semiconductor substrate without injecting separate dopants in a reaction chamber in an epitaxy process.

In accordance with the present invention, this object is accomplished by providing a method for epitaxially growing a compound semiconductor on a compound semiconductor substrate, comprising the steps of: loading the compound semiconductor substrate in a reaction chamber; injecting a Group V metal organic source gas not processed by a thermal pre-decomposition process and a Group III metal organic source gas processed by the thermal pre-decomposition process into the reaction chamber; and growing a p or n type compound semiconductor on the compound semiconductor substrate while adjusting the growth temperature of the p or n type compound semiconductor.

BRIEF DESCRIPTION OF THE DRAWING

Other objects and aspects of the invention will become apparent from the following description of embodiments with reference to the accompanying drawings in which.

DETAILED DESCRIPTION OF THE PREFERRED EMBODIMENTS

Figure 1:
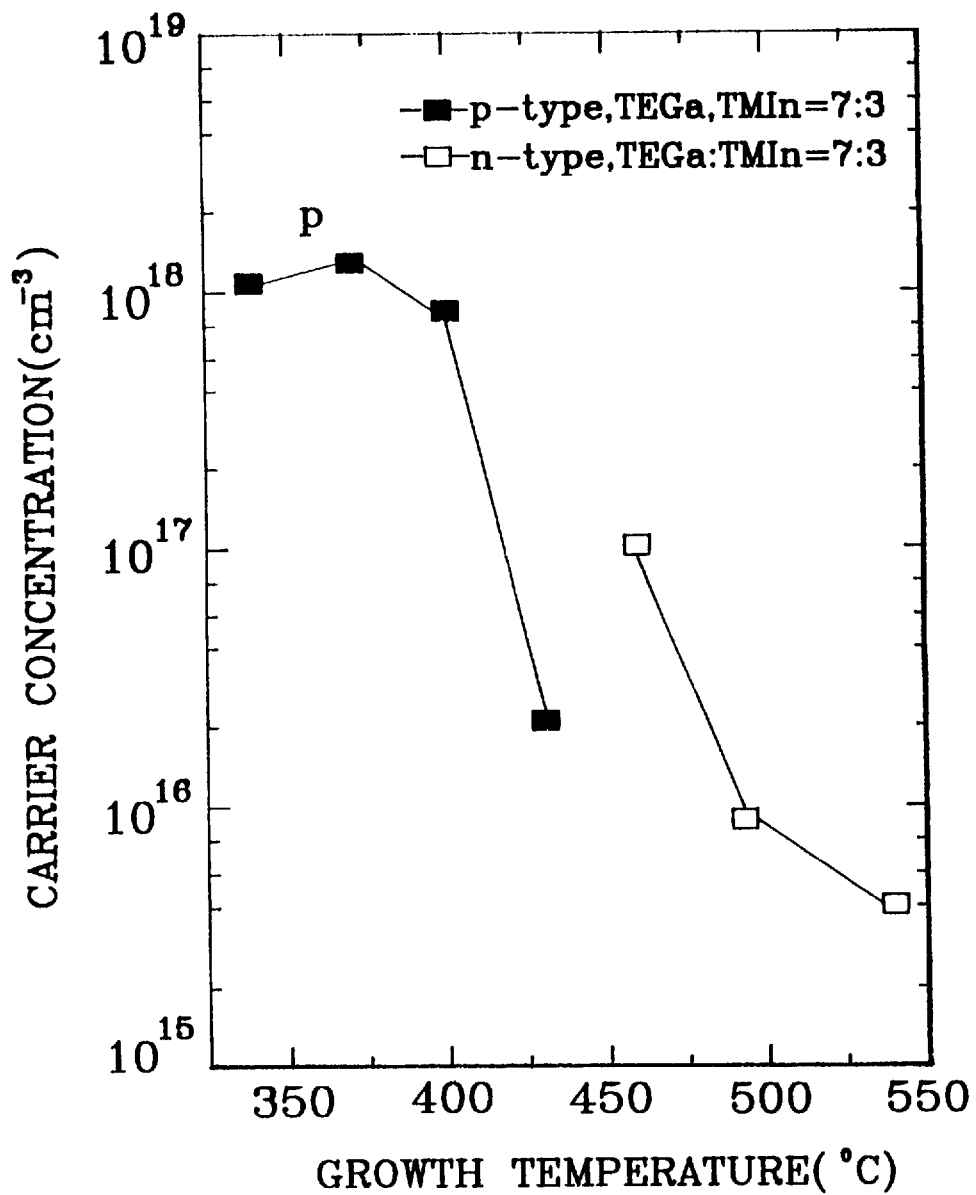
FIG. 1 is a graph depicting a variation in carrier concentration depending on a variation in growth temperature in an epitaxial growth according to the present invention.

In accordance with the present invention, a method for simply forming a p-n junction structure is provided. That is, the formation of the p-n junction structure is achieved by only controlling the growth temperature of an InGaAs compound semiconductor thin film with p and n type carriers in accordance with an ultra-high vacuum chemical vapor deposition (UHVCVD) using trimethylindium (TMI), triethylgallium (TEG) and monoethylarseine (MEA) not processed by a thermal pre-decomposition process and without using any separate impurity implantation or impurity diffusion processes.

For the deposition of the p type InGaAs compound semiconductor thin film, the growth temperature is maintained at less than 450° C. The growth time is also controlled, taking into consideration the desired thickness of the thin film.

Where a semiconductor requiring a p-n junction structure is to be fabricated, an n-type InGaAs layer is formed at a growth temperature higher than 450° C. over a p type InGaAs layer grown at a lower temperature.

In accordance with the present invention, p and n type InGaAs layers can be formed in a continuous manner while only controlling growth temperatures of those layers. Accordingly, it is possible to simply grow a p-n junction structure without using any separate impurity implantation process.

FIG. 1 is graph depicting variation in carrier concentration depending on variation in growth temperature in the epitaxial growth according to the present invention. Referring to FIG. 1, it can be found that in the deposition of a p type InGaAs compound semiconductor thin film, it is desirable to maintain the growth temperature at 450° C. or less. It is also found that where a p-n junction structure is to be formed, it is desirable to form an InGaAs layer at a growth temperature higher than 450° C. over the p type InGaAs layer grown at a lower temperature.

In accordance with the above-mentioned epitaxial growth method of the present invention, it is possible to form a p-n junction structure only by controlling its growth temperature without using any separate process for supplying an impurity source material. Accordingly, the overall fabrication process can be simplified. In accordance with the present invention, both the Group III and V source materials are used in a gas phase. This is advantageous as compared to the case using a source material in a solid phase. Since the Group III and V source materials are in a gas phase, there is an advantage in that a sharp interface can be obtained upon growing a heterojunction structure. Accordingly, the method of the present invention provides an advantage where it is applied to a doping process for ultra-fine structures.

In accordance with the present invention, it is also unnecessary to use any separate doping material upon forming a p-n heterojunction structure required to fabricate a semiconductor device. Moreover, the formation of the p-n heterojunction structure can be simplified. Accordingly, there is an economical advantage in terms of the cost of the used material and equipment. For example, although the growth temperature of the p-n heterojunction structure varies, the indium content of an InGaAs growth layer does not vary depending on the variation in growth temperature. Accordingly, the overall process can be very easily carried out.

The process of the present invention is a process wherein carbon exhibiting a low diffusion coefficient as the p or n type impurity can be effectively used. Accordingly, semiconductor devices fabricated using this process can exhibit superior characteristics in terms of stability and functionality.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. Formation of an InGaAs p-n junction by control of growth temperature comprising the steps of:

loading a compound semiconductor substrate into a reaction crucible;

injecting a Group V metal organic source gas not processed by a thermal pre-decomposition process and a Group III metal organic source gas processed by a thermal pre-decomposition process into the reaction chamber; and growing p and n type compound semiconductor layers on the compound semiconductor substrate by adjusting growth temperature.

2. The method of claim 1, wherein the growing step is carried out at a first temperature when the compound semiconductor being grown on the compound semiconductor substrate is a p type compound semiconductor that is lower than the temperature when the compound semiconductor being grown on the compound semiconductor substrate is an n type compound semiconductor.

3. The method of claim 2, wherein the growth temperature is maintained not higher than 450° C. when an InGaAs compound semiconductor thin film is deposited as an p type compound semiconductor.

4. The method of claim 2, wherein the growth temperature is maintained higher than 450° C. when an InGaAs compound semiconductor thin film is deposited as an n type compound semiconductor.

5. The method of claim 1, wherein:

the material of the Group III metal organic source gas comprises a trimethylindium or a triethylgallium, and the material of the Group V metal organic source gas comprises a monoethylarseine.

6. A method for p-n junction fabrication of an indium-containing material, said method comprising the steps of:

introducing Group V and Group III metal organic source gases into the presence of a temperature controlled compound indium-containing semiconductor substrate;

changing the controlled temperature of the substrate as compound Group V/III semiconductor growth occurs on the substrate to cause respectively corresponding successive layers of p-type and n-type indium-containing material to be formed without the successive introduction of different dopant material.

7. A method as in claim 6 wherein p and n type compound semiconductor layers are grown by respectively raising the growth temperature to obtain an n-type layer and lowering the temperature to obtain a p-type layer while maintaining constant source material inputs to the growing process.

8. A method as in claim 7 wherein the indium-containing material comprises InGaAs.

9. A method as in claim 7 wherein an n-type layer is grown at a temperature substantially greater than 450° C. and a p-type layer is grown at a temperature substantially less than 450° C.

10. A method as in claim 9 wherein:

the Group III source gas includes trimethylindium or triethylgallium; and the Group V source gas includes monoethylarseine.

* * * * *